(12) United States Patent
Liu et al.

(10) Patent No.: US 6,268,615 B1
(45) Date of Patent: Jul. 31, 2001

(54) PHOTODETECTOR

(75) Inventors: Cheewee Liu; Min-Hung Lee; I-Chen Lin, all of Taipei (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/447,086

(22) Filed: Nov. 22, 1999

(30) Foreign Application Priority Data

Jun. 21, 1999 (TW) ................................................ 88110369

(51) Int. Cl.⁷ ............................ H01L 29/06; H01L 39/00
(52) U.S. Cl. ............................. 257/30; 257/21; 257/25; 257/290; 257/291; 438/66; 438/73; 438/96
(58) Field of Search ............................. 257/21, 25, 291, 257/290, 292, 30; 438/96, 66, 73

(56) References Cited

U.S. PATENT DOCUMENTS

| | | | |
|---|---|---|---|
| 3,808,476 | * | 4/1974 | McCann, Jr. ..................... 317/235 R |
| 3,863,070 | * | 1/1975 | Wheeler et al. ..................... 250/339 |
| 3,911,465 | * | 10/1975 | Foss et al. ............................. 357/23 |
| 3,916,268 | * | 10/1975 | Engeler et al. ......................... 357/23 |
| 4,433,343 | * | 2/1984 | Levine ................................... 357/30 |
| 5,247,193 | * | 9/1993 | Menda ................................... 257/85 |
| 5,451,786 | * | 9/1995 | Kosai ................................. 250/338.4 |
| 5,932,902 | * | 8/1999 | Yonemoto ............................. 257/290 |
| 6,111,288 | * | 8/2000 | Watanabe et al. .................... 257/321 |
| 6,166,405 | * | 12/2000 | Kuriyama et al. .................... 257/290 |

FOREIGN PATENT DOCUMENTS

| | | | |
|---|---|---|---|
| 52-024479 | * | 2/1977 | (JP) ....................................... 257/290 |
| 61-012063 | * | 1/1986 | (JP) ....................................... 257/290 |

* cited by examiner

Primary Examiner—William Mintel
(74) Attorney, Agent, or Firm—Klein & Szekeres, LLP

(57) ABSTRACT

Disclosed is a photodetector adapted to be used with a voltage source for replacing the conventional CCD. The photodetector includes a substrate electrically connected with an electrode of the voltage source for generating electron-hole pairs in response to a light, a conducting layer electrically connected with the other electrode of the voltage source, and an ultra thin (~nm) insulating layer formed between the conducting layer and the substrate, wherein one of electrons and holes, excited by the light, in the substrate will move to the conducting layer through the insulating layer so as to form a photo current when the voltage source provides a bias voltage.

24 Claims, 9 Drawing Sheets

PHOTODETECTOR

FIELD OF THE INVENTION

The present invention is related to a photodetector which directly utilizes a gate current representative of the light intensity to obtain an optical signal about the information of image.

BACKGROUND OF THE INVENTION

Currently, the charge coupled device (CCD) is commonly used as an image detector and is widely applied in a scanner for scanning the plane pattern, a digital camera for recording the transient action, a video camera for recording sequential images, and a night vision equipment.

Because the charge packet stored in each storage cell (usually in a linear arrangement) of the CCD will be generated in response to the radiation of light and the magnitude of charge is directly proportional to the intensity of light, the readout signal in each storage cell must be processed by the successive steps to further obtain the information of the image. Moreover, the signal representative of the light intensity in each storage cell of the CCD must be outputted in a sequential manner, thereby reducing the signal-reading speed and decreasing the image recording rate. In addition, it also increases the complexity of rear circuits.

Thus, it is tried by the applicant to improve the above-described drawbacks of the CCD and to develop a preferred photodetector.

SUMMARY OF THE INVENTION

An object of the present invention is to provide a photodetector adapted to be used with a voltage source for replacing the conventional CCD or photogate sensor. This photodetector directly utilizes a gate current representative of the light intensity to obtain an optical signal about the information of image and thus can be used as an ideal image detector.

The photodetector includes a semiconductor substrate electrically connected with an electrode of the voltage source for generating electron-hole pairs in response to a light, a conducting layer electrically connected with the other electrode of the voltage source, and an insulating layer formed between the conducting layer and the substrate, wherein one of electrons and holes, excited by the light, in the substrate will move to the conducting layer through the insulating layer so as to form a photo current when the voltage source provides a bias voltage.

The substrate can be a p-type or n-type silicon substrate. Preferably, the substrate is made of amorphous material such as amorphous Si:H.

Preferably, the insulating layer is a silicon oxide layer. The silicon oxide layer is formed by oxidizing the surface of the substrate through low-pressure rapid thermal oxidation. The rapid thermal oxidation is preferably performed at 1000° C. The insulating layer has a thickness of about several nanometers, which is thin enough to have a quantum mechanical tunneling of electrons or holes from the substrate to the conducting layer. For current VLSI chips, the useful bias voltage for generating the quantum mechanical tunneling effect ranges from 1.8 to 3.3 V.

Certainly, the conducting layer can be an aluminum layer, a doped polysilicon layer, or a transparent conductor. An example of transparent conductor is a transparent electrode made of indium tin oxide (ITO).

In accordance with one aspect of the present invention, the voltage source provides the bias voltage to generate a quantum tunneling effect such that the excited electrons/holes move to the conducting layer to form the photo current, an intensity of which is directly proportional to an intensity of the light. The photo current can be read out from the gate constituted by the conducting layer and then processed to obtain an optical signal The present invention may best be understood through the following description with reference to the accompanying drawings, in which:

DETAILED DESCRIPTION OF THE PREFERRED EMBODIMENT

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

Figure 1:
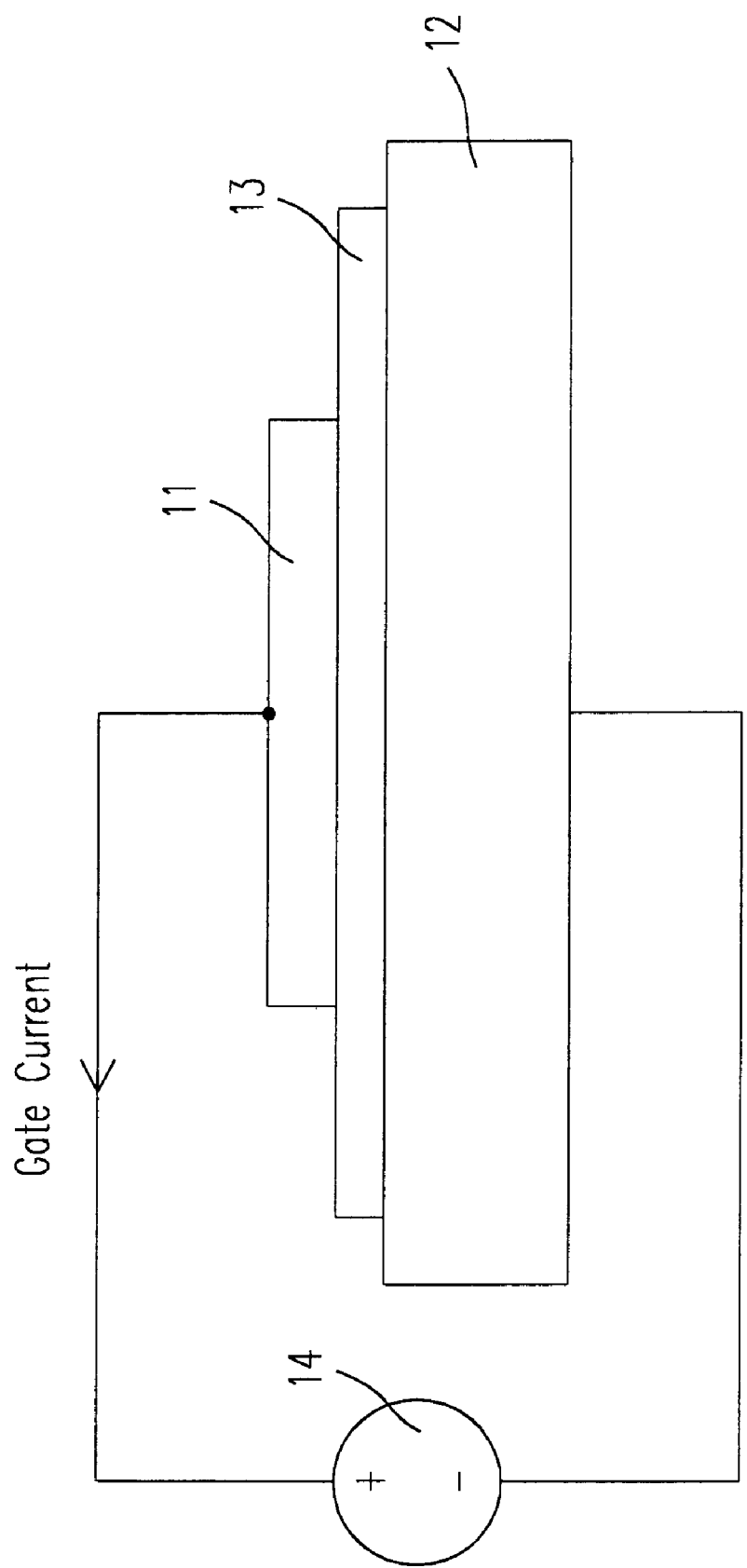
FIG. 1 is a schematic diagram showing the first preferred embodiment of the photodetector using an aluminum electrode as the gate according to the present invention.

The present invention provides a novel photodetector for replacing the conventional charge coupled device (CCD). Please refer to FIG. 1 showing the first preferred embodiment of the photodetector of the present invention. In this embodiment, the photodetector includes a conducting layer 11, a p-type silicon subtrate 12, an insulating layer 13, and a voltage source 14. The p-type semiconductor layer 12 is a p-type silicon substrate with a resistance of 2–5 Ω-cm. The insulating layer 13 is a silicon oxide layer having a thickness of 2.3 nm and formed by oxidizing the surface of the p-type silicon substrate 12 through low-pressure rapid thermal oxidation. The conducting layer 11 is an aluminum layer formed on the silicon oxide layer 13 and then patterned by a photolithographic and etching process to form the aluminum electrode with a surface area of $3\times10^{-4}$ cm$^2$. The p-type silicon subtrate 12 is electrically connected with the negative electrode of the voltage source and the conducting layer 11 is electrically connected to the positive electrode of the voltage source 14.

Figure 2:
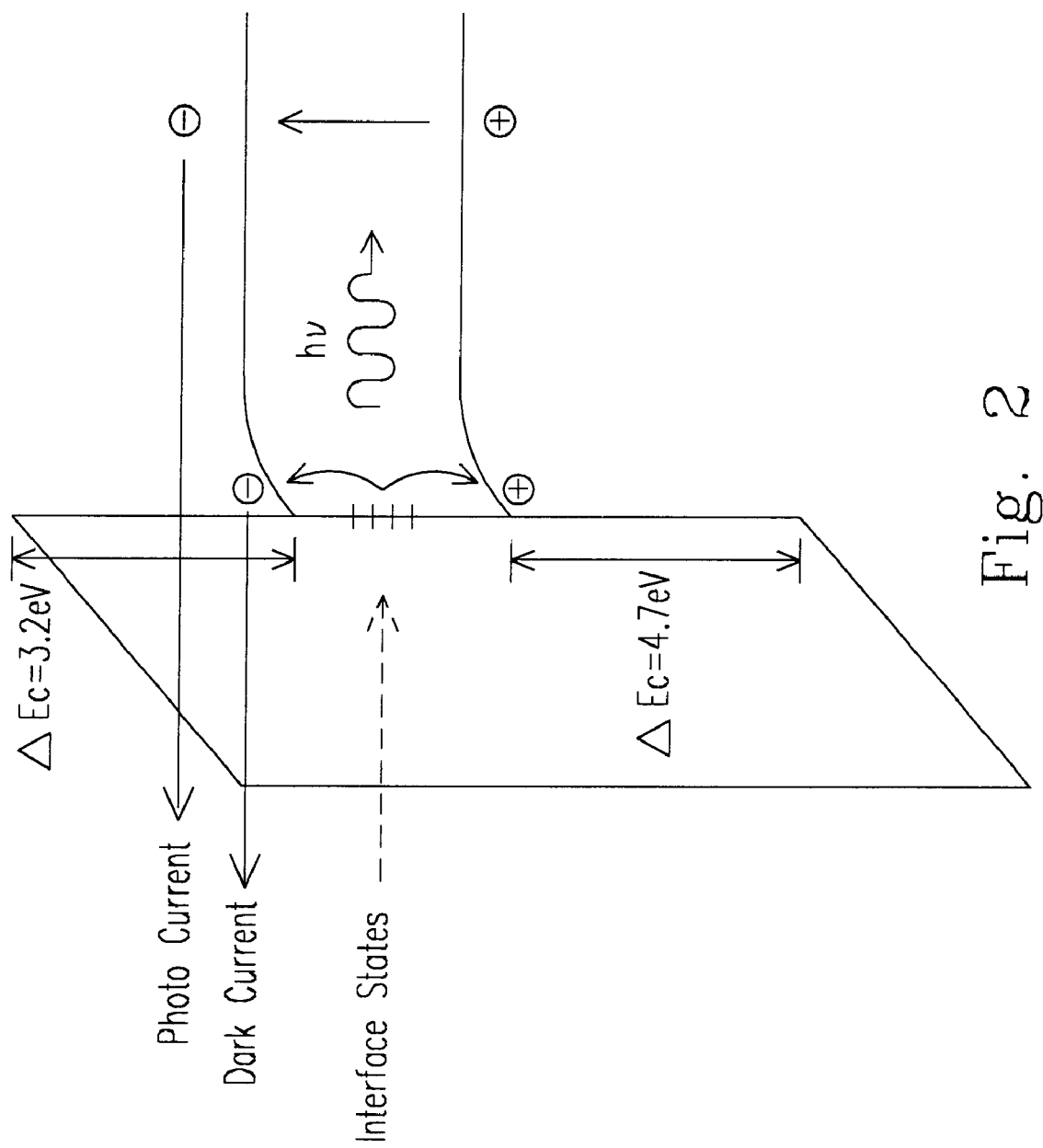
FIG. 2 is an energy band diagram of the working condition of the photodetector of FIG. 1.

Now, please refer to FIG. 2 showing the working condition of the photodetector of FIG. 1. In the condition free of light, the electron-hole pairs will be spontaneously generated through the interface states between the p-type silicon substrate 12 and the insulating layer 13 due to the thermal equilibrium. When the voltage source 14 provides a positive bias voltage, the energy level of the insulating layer near the conducting layer will be lowered. This can increase the penetrating capability of electrons, thereby generating a quantum tunneling effect. Therefore, at a sufficient positive bias voltage, the electrons can move to the gate constituted by the conducting layer 11 through the thin insulating layer 13. At this time, the current read from the gate (also named "gate current") is referred to as a dark current.

Under the same biased state as described above, when the p-type silicon substrate 12 is radiated by light and more electron-hole pairs will be generated, a large number of electrons will move to the conducting layer 11 by tunneling through the insulating layer 13, thereby forming a photo current. Because the intensity of photo current is directly proportional to that of light (power per unit of area), the photo current can be directly read out from the gate 11 and can be further processed so as to quickly obtain an optical signal about the information of image.

Figure 3:
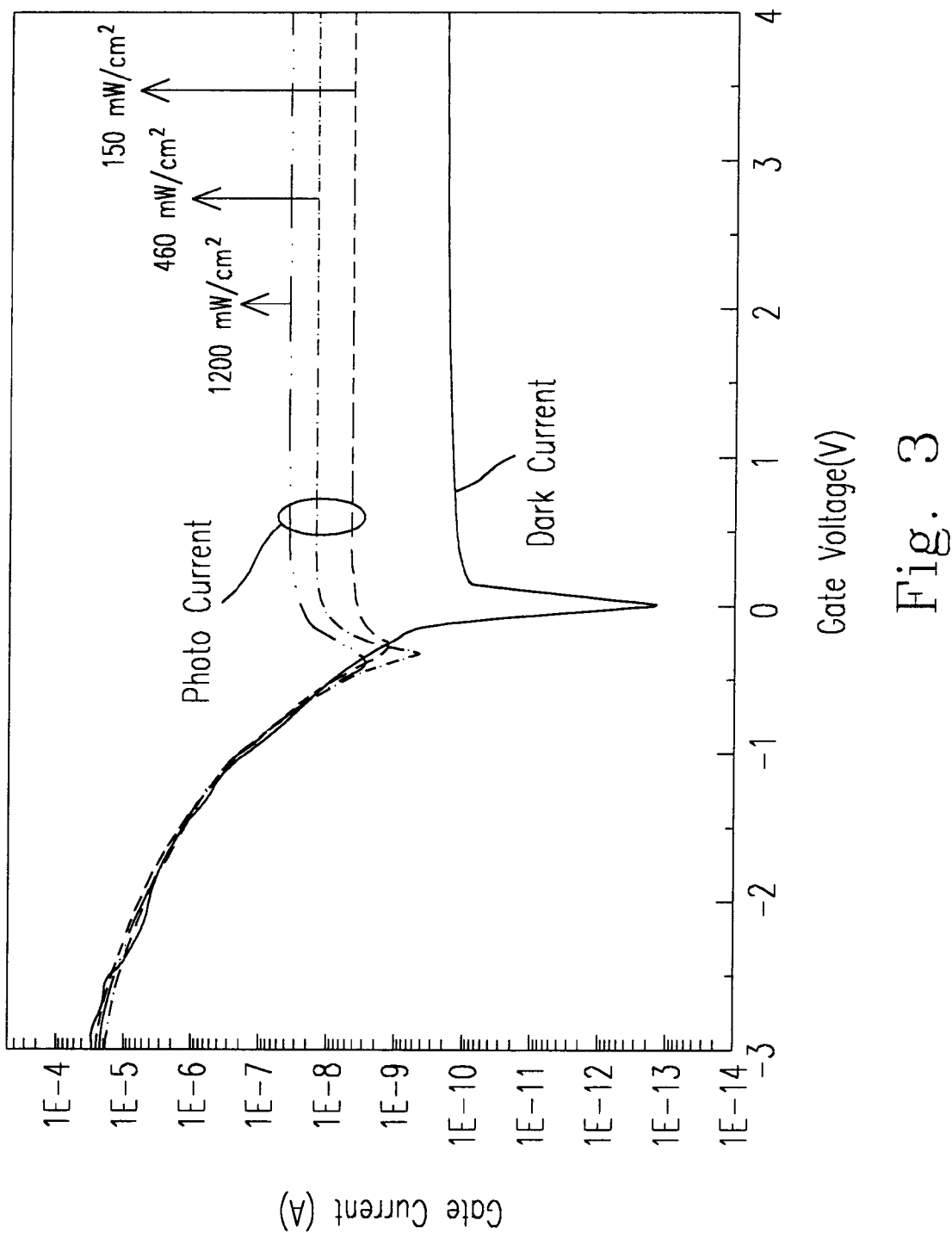
FIG. 3 shows the photo and dark current characteristics of the photodetector of FIG. 1.

Under the condition of light exposure, that is, radiated by a metal halide lamp with a spectrum similar to sunlight, the gate currents read from the gate at different bias voltages (also called "gate voltages") are shown in FIG. 3. As an excellent image-detecting device, its photo current must be quite larger than the dark current so as to increase the signal-to-noise ratio. It can be clearly observed from FIG. 3 that the photo current is increased very quickly and is greater than the dark current. Thus, it can prove that the photodetector of the present invention is suitably used as an image detector. In addition, from this figure, it can also be found that the gate current read from the gate under an appropriate positive bias voltage (approximately greater than 0.25 volts) is directly proportional to the intensity of light regardless of the bias voltage. When the bias voltage is greater than 0.5V, the dark current and photo current become saturated and will not be affected by the gate voltage. Therefore, it is completely conformable to the result concluded from the principle.

Figure 4:
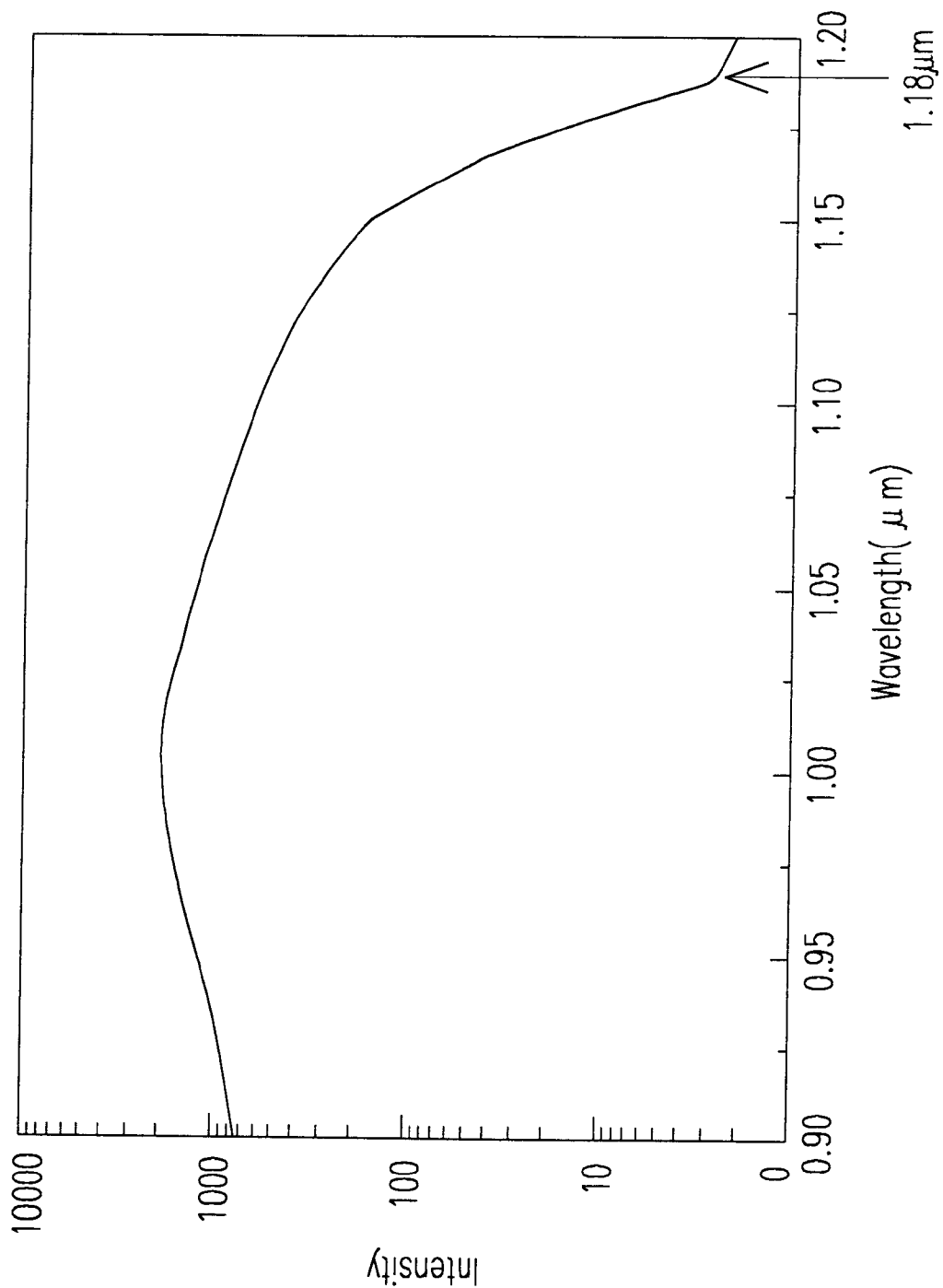
FIG. 4 is a graph showing the frequency spectrum of the photodetector of FIG. 1 in response to different wavelengths.

In addition, the frequency spectrum of photodetector of FIG. 1 in response to different wavelengths is measured and the result is shown in FIG. 4. When the wavelength of light is smaller than 1.1 $\mu$m, that is, the energy is larger than 1.1 eV (the bandgap of silicon), the electron-hole pairs can be generated in the silicon substrate (the generated electrons are called photoelectrons). Therefore, under the conditions of sufficient positive gate voltage and the ultra thin silicon oxide layer, the quantum tunneling effect can be significantly generated such that the photoelectrons can tunnel through the silicon oxide layer and move to the gate. As long as the energy of light wave is greater than the bandgap of silicon (1.1 eV), the photodetector of the present invention can effectively detect it. Thus, the photodetector of the present invention can detect the light wave with a wavelength less than 1.1 $\mu$m, including visible light, infrared rays, ultraviolet rays and X rays.

Figure 5:
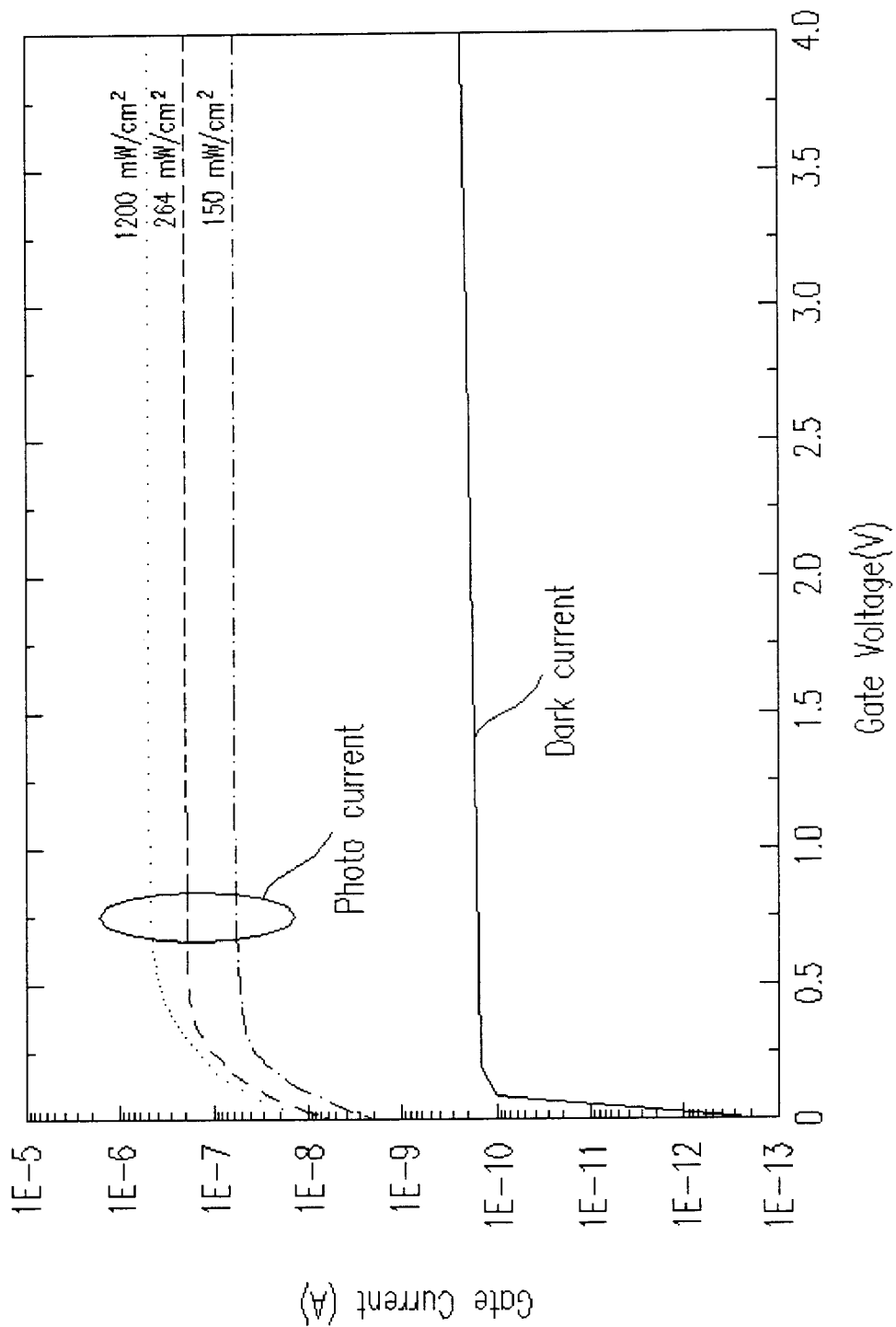
FIG. 5 shows the photo and dark current characteristics of the photodetector of FIG. 1, but the aluminum electrode is replaced by the transparent electrode made of indium tin oxide.

Because the above-described embodiment uses the light-tight aluminum electrode as the gate, the light can enter the silicon substrate only from the edge of the aluminum electrode such that this reduces the electron-hole pair generation in response to light. Therefore, the aluminum electrode can be replaced by the transparent electrode which is advantageous to an increase in the photo current. FIG. 5 shows the voltage-current characteristic of the gate of photodetector of FIG. 1 in which the aluminum electrode is replaced by the transparent electrode made of indium tin oxide. From FIG. 5, it can be found that the transparent electrode results in the greater photo current under the same intensity of light as that of FIG. 3 thereby obtaining a better device's characteristic.

Figure 6:
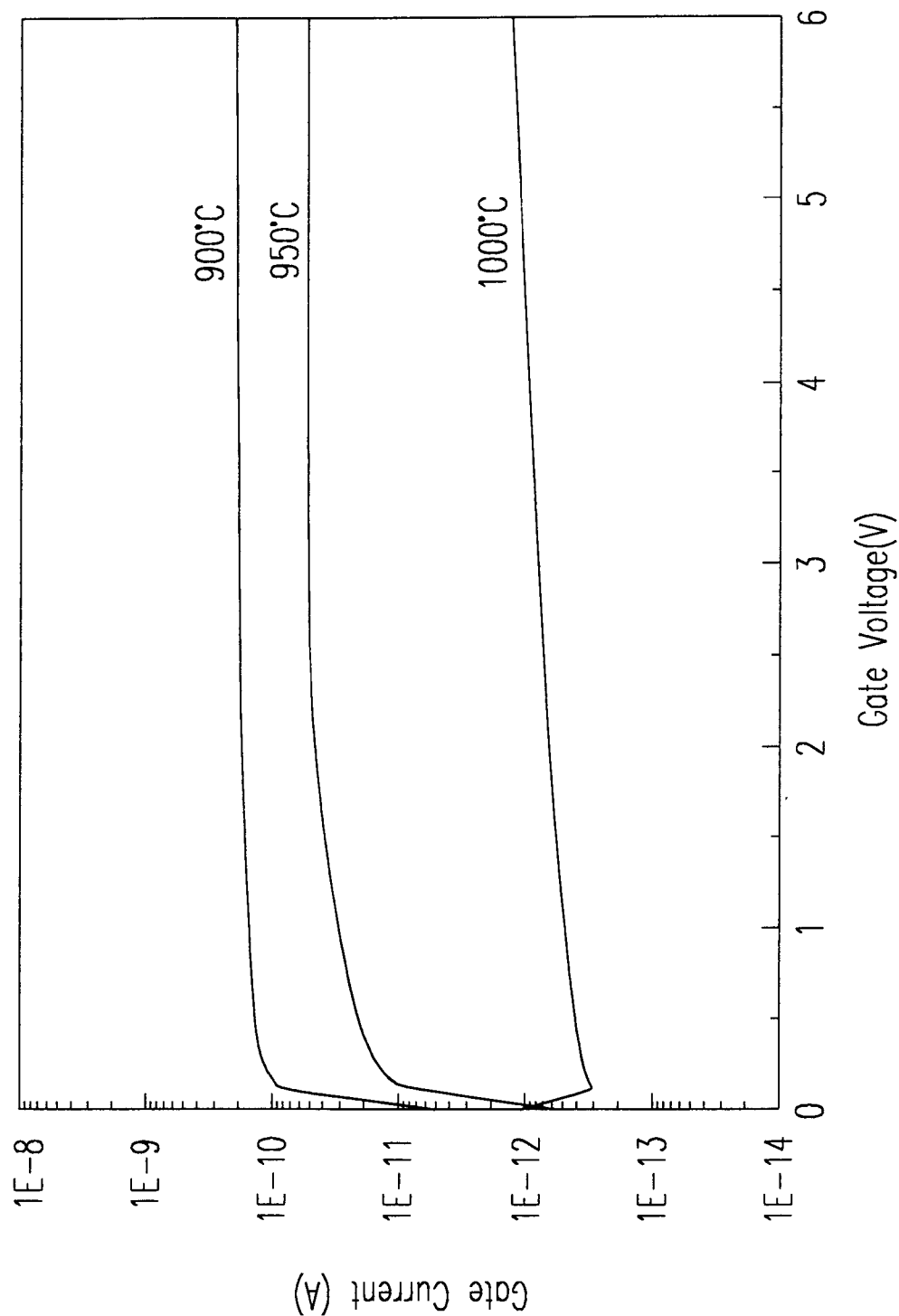
FIG. 6 is a graph showing the dark current read from the gate of photodetector of FIG. 1, in which the temperature of rapid thermal oxidation for growing the silicon dioxide layer is elevated from 900° C. to 950° C. or higher.

Furthermore, in order to reduce the dark current of the photodetector of the first embodiment for increasing the signal-to-noise ratio, the temperature of rapid thermal oxidation for growing the silicon oxide can be elevated from ordinary 900° C. to 950° C. or higher (about 1000° C.). This way can effectively decrease the dark current read from the gate, as shown in FIG. 6.

Figure 7:
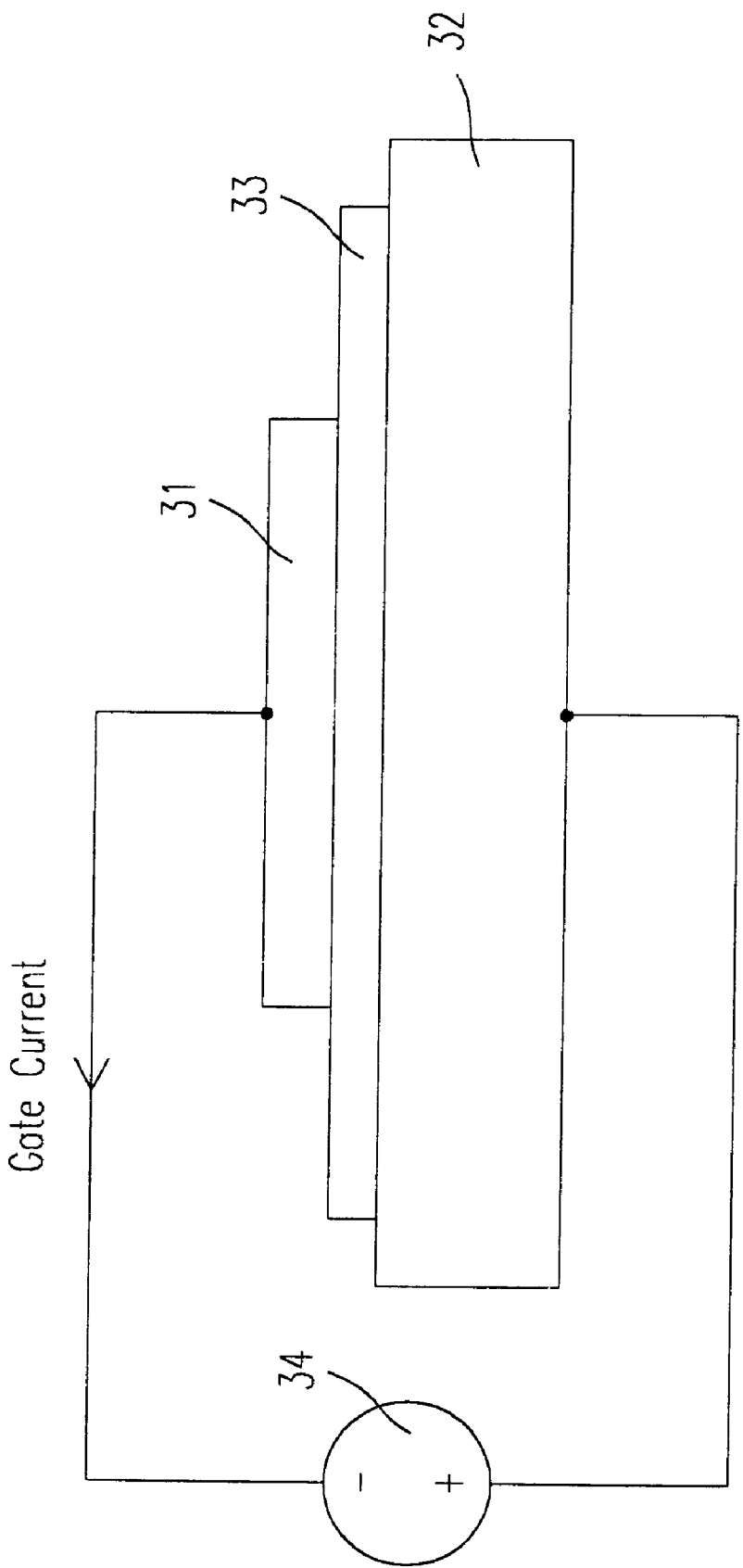
FIG. 7 is a schematic diagram showing the second preferred embodiment of the photodetector of the present invention.

In the second preferred embodiment of the present invention, the photodetector includes a conducting layer (or gate) 31, an n-type semiconductor layer 32, an insulating layer 33, and a voltage source 34. The n-type semiconductor layer 32 is electrically connected with a positive electrode of the voltage source 34 and the conducting layer 31 is electrically connected with a negative electrode of the voltage source 34 as shown in FIG. 7. Under the condition free of light, the electron-hole pairs will be spontaneously generated through the interface states between the n-type semiconductor layer 32 and the insulating layer 33. As shown in the energy band diagram of FIG. 8, when the voltage source 34 provides a negative bias voltage, the energy level of the insulating layer 33 near the conducting layer 31 is increased which can facilitate the tunneling capability of holes, thereby generating a quantum tunneling effect. Therefore, at a sufficient negative bias voltage, the holes move to the gate through the thin insulating layer 33. At this time, the current read from the gate is called a dark current. In the same biased state, when the n-type semiconductor layer 32 is radiated by light and more electron-hole pairs will be generated, a large number of holes will move to the conducting layer 31 through the insulating layer 33, thereby forming a photo current. Because the photo current is directly proportional to the intensity of light (power per unit of area), the photo current can be directly read out from the gate 31 and further processed so as to quickly obtain the information of image.

Figure 8:
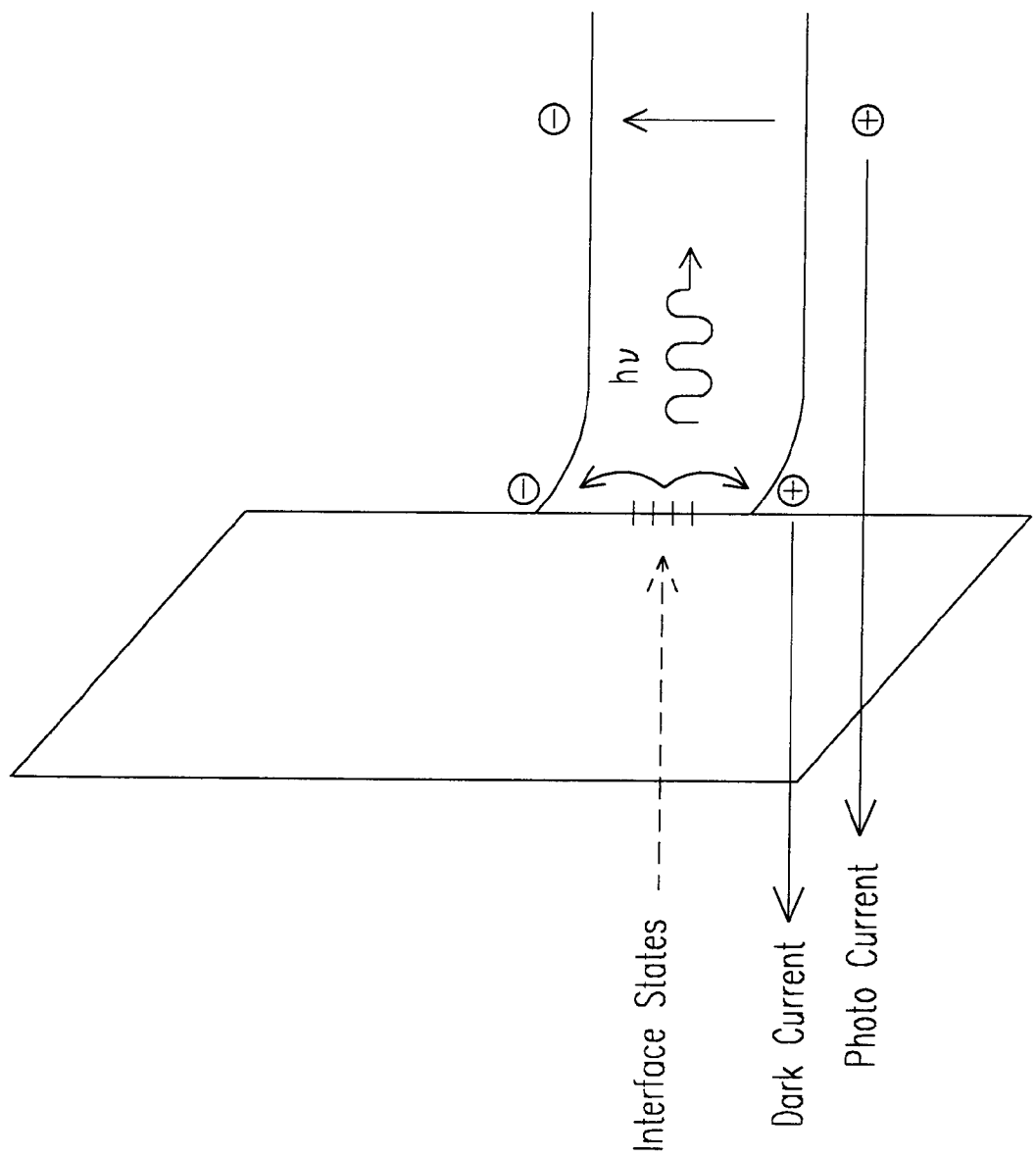
FIG. 8 is an energy band diagram of the working condition of the photodetector of FIG. 7.
Figure 9:
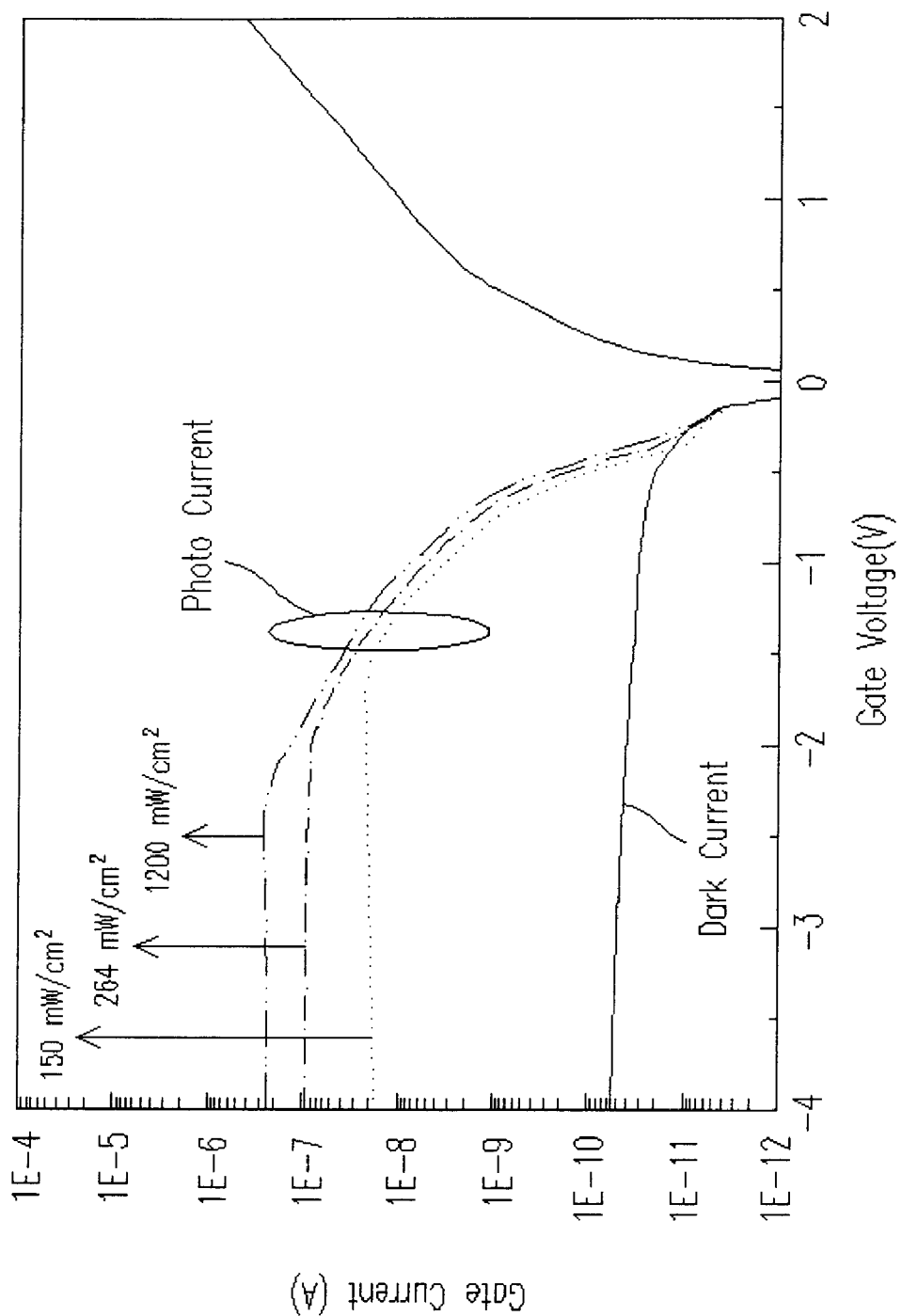
FIG. 9 shows the photo and dark current characteristics of the photodetector of FIG. 7.

Now, please refer to FIG. 9 showing the voltage-current characteristic of the gate of photodetector of FIG. 7, wherein the n-type semiconductor layer 32 is an n-type silicon substrate with a resistance of 1–10 $\Omega$-cm, the insulating layer 33 is a silicon oxide layer with a thickness of 3 nm, and other conditions are the same as those described in the first embodiment. In the condition free of light, the gate currents read from the gate at different bias voltages (or called as gate voltages) are shown in FIG. 8. Similarly, it can also be found that the intensity of gate current read from the gate under an appropriate negative bias voltage (approximately less than –2.25 volts) is directly proportional to the light intensity regardless of the bias voltage. When the magnitude of negative bias voltage is greater than 2V, the dark current and photo current become saturated. In this embodiment, because the valence and discontinuity between the silicon oxide layer and the silicon substrate is greater than the conduction band discontinuity, a larger negative bias voltage is required for generating the quantum tunneling effect.

In conclusion, the photodetector of the present invention utilizes the ultra thin insulating layer (about several nanometers) and an appropriate bias voltage (this value depends on the thickness of the insulating layer) to generate the quantum tunneling effect such that the photo current, respesentative of the light intensity, can be directly read out from the gate to obtain an optical signal about the information of image without needing any complicated timing circuit. Therefore, it can be applied in an image processing or digital signal processing system such as the scanner, digital camera, video camera, and night vision mirror, etc. Furthermore, the photodetector of the present invention can output every pixel of the signal in parallel so that it greatly increases the frame recording and outputting rate. Not only is this photodetector suitable for visible light detection, but it can detect infrared rays, UV rays, or X rays. As long as the energy of light wave is greater than the bandgap of silicon (1.1 eV), it will be always detected. Therefore, the "light" described herein is referred to as a light wave with a wavelength less than 1.1 μm.

In comparison with the conventional charge coupled device in which the signal representative of light intensity in each storage cell must be outputted in a sequential manner, the photodetector of the present invention can effectively increase the frame reading rate and simplify the complexity of the subsequent reading circuits thereby greatly enhancing its performance and reducing its manufacturing cost. The photodetector of the present invention can be integrated on the semiconductor substrate to replace the conventional CCD and serve as an image-detecting device.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A photodetector adapted to be used with a voltage source, comprising:
    a substrate electrically connected with an electrode of said voltage source for generating electron-hole pairs in response to a light;
    a conducting layer electrically connected with the other electrode of said voltage source; and
    an insulating layer formed between said conducting layer and said substrate, wherein one of electrons and holes, excited by said light, in said substrate will move to said conducting layer through said insulating layer by a quantum mechanical tunneling effect when said voltage source provides a bias voltage so as to form a photo current.

2. The photodetector according to claim 1 wherein said semiconductor substrate is one selected from a group consisting of a p-type silicon substrate and an n-type silicon substrate.

3. The photodetector according to claim 1 wherein said substrate is made of amorphous material composed of amorphous silicon hydrogen alloys.

4. The photodetector according to claim 1 wherein said insulating layer is a silicon oxide layer.

5. The photodetector according to claim 4 wherein said silicon oxide layer is formed by oxidizing a surface of said substrate through a rapid thermal oxidation.

6. The photodetector according to claim 5 wherein said rapid thermal oxidation is performed at 1000° C.

7. The photodetector according to claim 1 wherein said insulating layer has a thickness of about several nanometers to ensure that said quantum tunneling effect is generated at a useful bias voltage.

8. The photodetector according to claim 1 wherein said conducting layer is one selected from a group consisting of an aluminum layer, a doped polysilicon layer, and a transparent conductor.

9. The photodetector according to claim 8 wherein said transparent conductor is made of indium tin oxide (ITO).

10. The photodetector according to claim 1 wherein said voltage source provides said bias voltage for generating a quantum tunneling effect such that said excited electrons/holes move to said conducting layer thereby generating said photo current, an intensity of which is directly proportional to an intensity of said light.

11. A photodetector adapted to be used with a voltage source, comprising:
    a p-type semiconductor layer electrically connected with a negative electrode of said voltage source for generating electron-hole pairs in response to a light;
    a conducting layer electrically connected with a positive electrode of said voltage source; and
    an insulating layer formed between said conducting layer and said p-type semiconductor layer, wherein electrons, excited by said light, in said p-type semiconductor layer will move to said conducting layer through said insulating layer so as to form a photo current when said voltage source provides a positive bias voltage on said conducting layer.

12. The photodetector according to claim 11 wherein said p-type semiconductor layer is a p-type silicon substrate.

13. The photodetector according to claim 11 wherein said p-type semiconductor layer is formed from a p-type amorphous material made of amorphous silicon hydrogen alloys.

14. The photodetector according to claim 11 wherein said insulating layer is a silicon oxide layer.

15. The photodetector according to claim 14 wherein said silicon oxide layer is formed by oxidizing a surface of said p-type semiconductor layer through a rapid thermal oxidation.

16. The photodetector according to claim 11 wherein said insulating layer has a thickness of about several nanometers to ensure that a quantum tunneling effect is generated at a useful bias voltage.

17. The photodetector according to claim 11 wherein said voltage source provides said positive bias voltage to generate a quantum tunneling effect such that said excited electrons move to said conducting layer to generate said photo current, an intensity of which is directly proportional to an intensity of said light.

18. A photodetector adapted to be used with a voltage source, comprising:
    an n-type semiconductor layer electrically connected with a positive electrode of said voltage source for generating electron-hole pairs in response to a light;
    a conducting layer electrically connected with a negative electrode of said voltage source; and
    an insulating layer formed between said conducting layer and said n-type semiconductor layer, wherein holes in said n-type semiconductor layer will move to said conducting layer through said insulating layer when said voltage source provides a negative bias voltage so as to form a photo current.

19. The photodetector according to claim 18 wherein said n-type semiconductor layer is formed from an n-type amorphous material made of amorphous silicon hydrogen alloys.

20. The photodetector according to claim 18 wherein said insulating layer is a silicon oxide layer.

21. The photodetector according to claim 20 wherein said silicon oxide layer is formed by oxidizing a surface of said n-type semiconductor layer through a rapid thermal oxidation.

22. The photodetector according to claim 18 wherein said insulating layer has a thickness of about several nanometers to ensure that a quantum tunneling effect is generated at a useful bias voltage.

23. The photodetector according to claim 18 wherein said voltage source provides said negative bias voltage to generate a quantum tunneling effect such that said holes move to said conducting layer to generate said photo current, an intensity of which is directly proportional to an intensity of said light.

24. A photodetector comprising:
   a voltage source for providing a bias voltage;
   a semiconductor substrate electrically connected with an electrode of said voltage source for generating electron-hole pairs in response to a light;
   a conducting layer electrically connected with the other electrode of said voltage source; and
   an insulating layer formed between said conducting layer and said substrate, wherein one of electrons and holes, excited by said light, in said substrate will move to said conducting layer through said insulating layer so as to form a photo current in response to said bias voltage.

* * * * *